(12) United States Patent
Hontake et al.

(10) Patent No.: US 8,010,221 B2
(45) Date of Patent: Aug. 30, 2011

(54) CLEANING APPARATUS AND METHOD FOR IMMERSION LIGHT EXPOSURE

(75) Inventors: Kouichi Hontake, Koshi (JP); Masashi Enomoto, Koshi (JP); Hideharu Kyouda, Koshi (KR)

(73) Assignee: Tokyo Electron Limited, Tokyo (JP)

( * ) Notice: Subject to any disclaimer, the term of this patent is extended or adjusted under 35 U.S.C. 154(b) by 850 days.

(21) Appl. No.: 11/949,287

(22) Filed: Dec. 3, 2007

(65) Prior Publication Data

US 2008/0133045 A1    Jun. 5, 2008

(30) Foreign Application Priority Data

Dec. 4, 2006    (JP) .................................. 2006-326908

(51) Int. Cl.
*G06F 19/00* (2011.01)
*H01L 21/00* (2006.01)

(52) U.S. Cl. ........................................... 700/121; 438/5
(58) Field of Classification Search ........................ 438/5
See application file for complete search history.

(56) References Cited

U.S. PATENT DOCUMENTS

| | | | |
|---|---|---|---|
| 6,432,212 B1* | 8/2002 | Hirose et al. | 134/6 |
| 6,663,245 B2* | 12/2003 | Kim et al. | 359/508 |
| 6,770,149 B2* | 8/2004 | Satou et al. | 134/10 |
| 7,115,424 B2* | 10/2006 | Nakao | 438/5 |
| 2003/0005948 A1* | 1/2003 | Matsuno et al. | 134/33 |
| 2004/0089328 A1* | 5/2004 | Sato et al. | 134/102.2 |
| 2004/0134515 A1* | 7/2004 | Castrucci | 134/2 |
| 2004/0206379 A1* | 10/2004 | Okuda et al. | 134/102.1 |
| 2005/0136610 A1* | 6/2005 | Kitagawa et al. | 438/402 |
| 2006/0231206 A1 | 10/2006 | Nagasaka et al. | |
| 2006/0261038 A1* | 11/2006 | Verhaverbeke et al. | 216/83 |
| 2007/0049166 A1* | 3/2007 | Yamaguchi et al. | 451/5 |

OTHER PUBLICATIONS

Yan et al., Optimization of pulsed carbon dioxide snow jet for cleaning CMOS image sensors by using Taguchi methods, Nov. 2006).*

* cited by examiner

*Primary Examiner* — Ramesh B Patel
*Assistant Examiner* — Darrin Dunn
(74) *Attorney, Agent, or Firm* — Oblon, Spivak, McClelland, Maier & Neustadt, L.L.P.

(57) ABSTRACT

A cleaning apparatus for immersion light exposure includes a cleaning apparatus main body including a mechanism configured to perform a cleaning process on the substrate, and a control section configured to control respective components of the cleaning apparatus main body. The control section is arranged to fabricate a new process recipe in response to input of a surface state of a film formed on a substrate, such that the new process recipe contains hardware conditions and/or process conditions corresponding to the surface state, with reference to relationships stored therein between parameter values representing a surface state of a film formed on a substrate and hardware conditions and/or process conditions for performing suitable cleaning for the parameter values; and to control the cleaning apparatus main body to perform a cleaning process in accordance with the new process recipe.

20 Claims, 6 Drawing Sheets

CLEANING APPARATUS AND METHOD FOR IMMERSION LIGHT EXPOSURE

BACKGROUND OF THE INVENTION

1. Field of the Invention

The present invention relates to a cleaning apparatus and cleaning method for immersion light exposure, for cleaning a substrate, such as a semiconductor wafer, before and/or after immersion light exposure arranged to subject a resist film formed on the surface of the substrate to a light exposure process through a liquid. The present invention further relates to a control apparatus and storage medium for controlling a cleaning apparatus for immersion light exposure.

2. Description of the Related Art

In the process of manufacturing semiconductor devices, photolithography techniques are used for forming circuit patterns on target substrates, such as semiconductor wafers (which will be simply referred to as "wafer", hereinafter). Where a circuit pattern is formed by use of photolithography, the process steps are performed, as follows. Specifically, a resist liquid is first applied to a wafer to form a resist film. Then, the resist film is irradiated with light to perform light exposure on the resist film in accordance with the circuit pattern. Then, the resist film is subjected to a developing process. Such photolithography techniques are performed in a system comprising a coating/developing apparatus including a plurality of processing units integrated therein for performing a series of processes, such as resist coating and development after light exposure, as well as a light exposure apparatus connected to the coating/developing apparatus.

In recent years, the integration degree of semiconductor devices becomes increasingly higher to improve the operation speed and so forth. Accordingly, photolithography techniques are required to increase the miniaturization level of circuit patterns formed on wafers. As a photolithography technique for realizing a high resolution of a 45-nm node level, there has been proposed the following immersion light exposure (for example, see U.S. Patent Application Publication No. US 2006/0231206 A1). In this immersion light exposure, a light exposure liquid, such as purified water, having a refractive index higher than air is supplied between the wafer and light exposure projection lens. The wavelength of light radiated from the projection lens is shortened by means of the refractive index of the light exposure liquid, so that the line width obtained by the light exposure is decreased.

Since the immersion light exposure is a technique for performing light exposure through a liquid, wafers to be loaded into the light exposure apparatus should be cleaned more than ever. Further, part of the liquid deposited on wafers during the immersion light exposure may affect subsequent processes. Accordingly, in the case of the immersion light exposure, cleaning is performed on wafers before and/or after the light exposure.

Each of the cleaning processes prior to and subsequent to the light exposure is arranged as a rinsing process using purified water, in general. Since cleaning characteristics vary depending on the type of films formed on wafers, it is necessary to select optimum process conditions and to change hardware conditions, when the type of films is changed. Conventionally, adjustments for the selection and change described above need to be manually performed, thereby taking a long time and lowering the throughput. Further, where adjustments of conditions are manually performed, the process may be insufficiently optimized.

BRIEF SUMMARY OF THE INVENTION

An object of the present invention is to provide a cleaning apparatus and cleaning method for immersion light exposure, which can efficiently perform a cleaning process on a substrate under suitable conditions before and/or after immersion light exposure.

Another object of the present invention is to provide a control apparatus and a computer readable storage medium that stores a control program, both for controlling a cleaning apparatus for immersion light exposure.

According to a first aspect of the present invention, there is provided a cleaning apparatus for immersion light exposure, for cleaning a substrate before and/or after immersion light exposure arranged to subject a resist film formed on a surface of the substrate to a light exposure process through a liquid, the cleaning apparatus comprising: a cleaning apparatus main body comprising a mechanism configured to perform a cleaning process on the substrate; and a control section configured to control respective components of the cleaning apparatus main body, wherein the control section is arranged to fabricate a new process recipe in response to input of a surface state of a film formed on a substrate, such that the new process recipe contains hardware conditions and/or process conditions corresponding to the surface state, with reference to relationships stored therein between parameter values representing a surface state of a film formed on a substrate and hardware conditions and/or process conditions for performing suitable cleaning for the parameter values; and to control the cleaning apparatus main body to perform a cleaning process in accordance with the new process recipe.

In the first aspect, the cleaning apparatus may have a structure such that the control section has a basic recipe with basic process conditions contained therein, and is configured to fabricate the new process recipe by changing hardware conditions and/or process conditions of the basic recipe or creating hardware conditions and/or process conditions, with reference to the relationships. The cleaning apparatus may have a structure such that the control section has a plurality of basic recipes, and is configured to fabricate the new process recipe by changing hardware conditions and/or process conditions of a selected one of the basic recipes or creating hardware conditions and/or process conditions.

In the first aspect, the control section may be arranged to use a contact angle as a parameter representing a surface state of a film formed on a substrate. In this case, the cleaning apparatus may have a structure such that the cleaning apparatus main body includes, as the components, a spin chuck configured to hold and rotate the substrate, a cleaning liquid nozzle configured to supply a cleaning liquid onto the substrate held on the spin chuck, and an $N_2$ gas nozzle configured to supply $N_2$ gas onto the substrate, and the control section is arranged to use, as the hardware conditions and/or process conditions, a type of the cleaning liquid nozzle, an angle of the cleaning liquid nozzle, use or nonuse of $N_2$ gas supply, a cleaning liquid delivery rate, and a rotational speed of the substrate in cleaning liquid delivery.

In the first aspect, the control section may be arranged to use a contact angle, a surface electric potential, and an average surface roughness as parameters representing a surface state of a film formed on a substrate. In this case, the cleaning apparatus may have a structure such that the cleaning apparatus main body includes, as the components, a spin chuck configured to hold and rotate the substrate, a cleaning liquid nozzle configured to supply a cleaning liquid onto the substrate held on the spin chuck, an $N_2$ gas nozzle configured to supply $N_2$ gas onto the substrate, and an ionizer configured to remove electric charge from a surface of the substrate, and the control section is arranged to use, as the hardware conditions and/or process conditions, a type of the cleaning liquid nozzle, an angle of the cleaning liquid nozzle, use or nonuse of $N_2$ gas supply, use or nonuse of the ionizer to remove electric charge from a surface of the substrate, a cleaning liquid delivery rate, and a rotational speed of the substrate in cleaning liquid delivery.

According to a second aspect of the present invention, there is provided a cleaning method for immersion light exposure, for cleaning a substrate before and/or after immersion light exposure arranged to subject a resist film formed on a surface of the substrate to a light exposure process through a liquid, the cleaning method comprising: storing relationships between parameter values representing a surface state of a film formed on a substrate and hardware conditions and/or process conditions for performing suitable cleaning for the parameter values; referring to a surface state of a film formed on a substrate; fabricating a new process recipe with reference to the relationships, such that the new process recipe contains hardware conditions and/or process conditions corresponding to the surface state; and performing a cleaning process in accordance with the new process recipe.

In the second aspect, the cleaning method may have an arrangement such that said fabricating a new process recipe comprises fabricating the new process recipe by changing hardware conditions and/or process conditions of a basic recipe with basic process conditions contained therein or creating hardware conditions and/or process conditions, with reference to the relationships. The cleaning method may have an arrangement such that said fabricating a new process recipe comprises fabricating the new process recipe by changing hardware conditions and/or process conditions of a selected one of a plurality of basic recipes or creating hardware conditions and/or process conditions.

In the second aspect, a contact angle may be used as a parameter representing a surface state of a film formed on a substrate. In this case, the cleaning method may have an arrangement such that used as the hardware conditions and/or process conditions are a type of a cleaning liquid nozzle configured to supply a cleaning liquid onto the substrate, an angle of the cleaning liquid nozzle, use or nonuse of $N_2$ gas supply onto the substrate, a cleaning liquid delivery rate, and a rotational speed of the substrate in cleaning liquid delivery.

In the second aspect, a contact angle, a surface electric potential, and an average surface roughness may be used as parameters representing a surface state of a film formed on a substrate. In this case, the cleaning method may have an arrangement such that used as the hardware conditions and/or process conditions are a type of a cleaning liquid nozzle configured to supply a cleaning liquid onto the substrate, an angle of the cleaning liquid nozzle, use or nonuse of $N_2$ gas supply onto the substrate, use or nonuse of removal of electric charge from a surface of the substrate, a cleaning liquid delivery rate, and a rotational speed of the substrate in cleaning liquid delivery.

According to a third aspect of the present invention, there is provided a control apparatus for controlling a cleaning apparatus for immersion light exposure, the control apparatus comprising: a storage part that stores relationships between parameter values representing a surface state of a film formed on a substrate and hardware conditions and/or process conditions for performing suitable cleaning for the parameter values; an input part for inputting a surface state of a film formed on a substrate; and an arithmetical operation part arranged to fabricate a new process recipe with reference to the relationships in response to input of a surface state of a film formed on a substrate, such that the new process recipe contains hardware conditions and/or process conditions corresponding to the surface state, and to cause a cleaning process to be performed in accordance with the new process recipe.

According to a fourth aspect of the present invention, there is provided a computer readable storage medium that stores a control program for execution on a computer for controlling a cleaning apparatus for immersion light exposure, the control program, when executed, causing the computer to fabricate a new process recipe in response to input of a surface state of a film formed on a substrate, such that the new process recipe contains hardware conditions and/or process conditions corresponding to the surface state, with reference to relationships between parameter values representing a surface state of a film formed on a substrate and hardware conditions and/or process conditions for performing suitable cleaning for the parameter values; and to control the cleaning apparatus for immersion light exposure to perform a cleaning process in accordance with the new process recipe.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will now be described with reference to the accompanying drawings.

Figure 1:
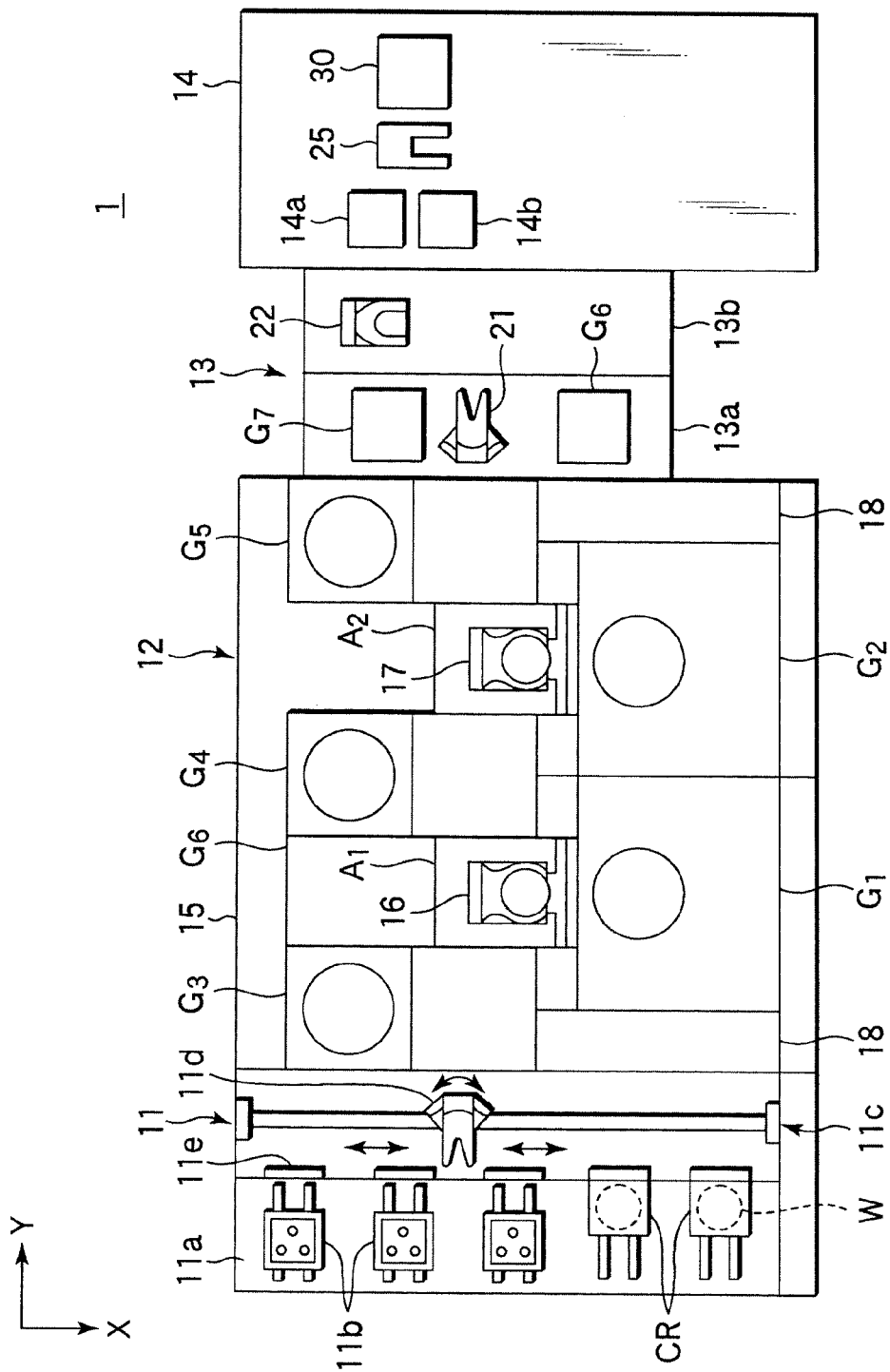
FIG. 1 is a plan view schematically showing a pattern forming system that includes a cleaning unit for immersion light exposure according to an embodiment of the present invention.
Figure 2:
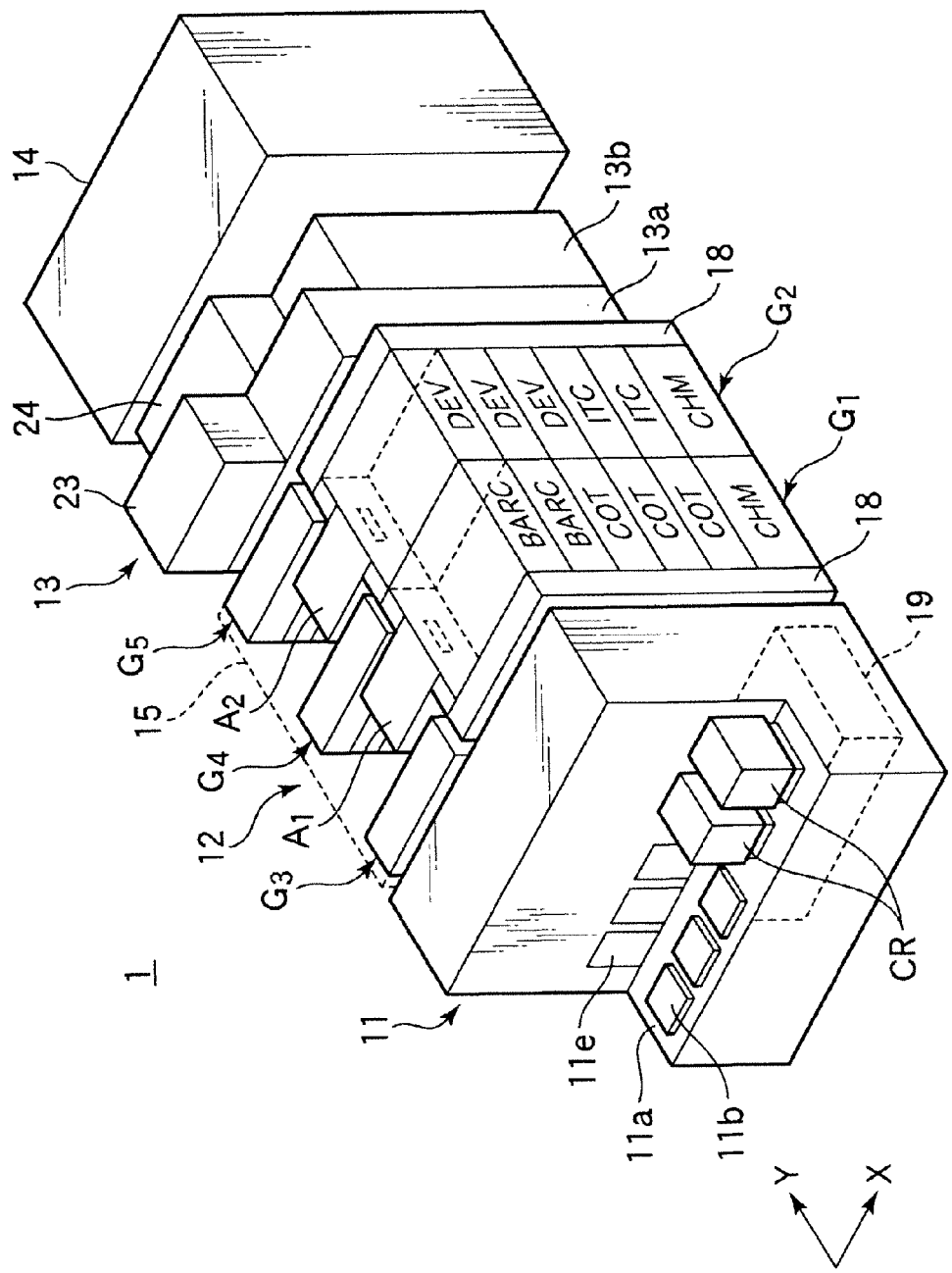
FIG. 2 is a perspective view schematically showing the pattern forming system shown in FIG. 1.

FIG. 1 is a plan view schematically showing a pattern forming system that includes a cleaning unit for immersion light exposure according to an embodiment of the present invention. FIG. 2 is a perspective view schematically showing the pattern forming system.

The pattern forming system 1 is designed to form a predetermined resist pattern on a semiconductor substrate or wafer W. This pattern forming system 1 includes a cassette station 11 used as a transfer station for wafers W, a process station 12 comprising a plurality of processing units each for performing a predetermined process on a wafer W, a light exposure apparatus 14 for performing a light exposure process on a wafer W, and an interface station 13 for transferring wafers W between the process station 12 and light exposure apparatus 14. The cassette station 11, process station 12, interface station 13, and light exposure apparatus 14 are arrayed in series in this order in the longitudinal direction of the pattern forming system 1 (Y-direction).

The cassette station 11 includes a cassette table 11a for placing thereon wafer cassettes (CR) each storing a plurality of, such as 13, wafers W, and a wafer transfer mechanism 11c for transferring wafers W between the wafer cassettes (CR) placed on the cassette table 11a and a transit unit located in a third processing unit group $G_3$ in the process station 12 described later. The cassette table 11a has a plurality of, such as 5, positioning portions 11b each for positioning a wafer cassette (CR), arrayed thereon in the width direction of the pattern forming system 1 (X-direction). A wafer cassette (CR) is placed at each of the positioning portions 20a such that its transfer port faces an opening/closing portion 11e formed in a wall of the casing of the wafer transfer mechanism 11c. The wafer transfer mechanism 11c includes a transfer pick 11d disposed in the casing for handling wafers W, so that the wafers W are transferred by the transfer pick 11d between the wafer cassettes (CR) on the cassette table 11a and the transit unit.

The process station 12 is arranged in a casing 15, on the front side of which (lower side in FIG. 1), the process station 12 includes a first processing unit group $G_1$ and a second processing unit group $G_2$ arrayed in this order from the cassette station 11 toward the interface station 13. On the rear side of the casing 15 (upper side in FIG. 1), the process station 12 includes a third processing unit group $G_3$, a fourth processing unit group $G_4$, and a fifth processing unit group $G_5$ arrayed in this order from the cassette station 11 toward the interface station 13. Further, the process station 12 includes a first main transfer section $A_1$ interposed between the third processing unit group $G_3$ and fourth processing unit group $G_4$, and a second main transfer section $A_2$ interposed between the fourth processing unit group $G_4$ and fifth processing unit group $G_5$.

The first processing unit group $G_1$ includes a plurality of processing units stacked one on the other, which are formed of, e.g., two bottom coating units (BARC) for forming an anti-reflective coating that prevents reflection of light during light exposure on a wafer W, and three resist coating units (COT) for performing resist coating on the surface of a wafer W to form a resist film. The second processing unit group $G_2$ includes a plurality of processing units stacked one on the other, which are formed of, e.g., three development units (DEV) for developing a resist film formed on a wafer W after light exposure, and two top coating units (ITC) for supplying a protection liquid onto the surface of a resist film formed on a wafer W to form a protection film, which is used as a liquid repellent film repellent to an immersion light exposure liquid described later.

Each of the third processing unit group $G_3$, fourth processing unit group $G_4$, and fifth processing unit group $G_5$ includes a plurality of, such as 10, processing units stacked one on the other, which are formed of, e.g., an adhesion unit for performing a hydrophobic process on a wafer W, a pre-baking unit for performing a heating process on a wafer W after resist coating, a post-baking unit for performing a heating process on a wafer W after development, a post-exposure baking unit for performing a heating process on a wafer W after light exposure and before development, and so forth. The third processing unit group $G_3$ includes a transit unit through which wafers W are transferred between the cassette station 11 and first main transfer section $A_1$. The fifth processing unit group $G_5$ includes a transit unit through which wafers W are transferred between the second main transfer section $A_2$ and a first wafer transfer mechanism 21 used in the interface station 13 described later.

The first main transfer section $A_1$ is provided with a first main wafer transfer arm 16 for handling wafers W, which can selectively access the units located in the first processing unit group $G_1$, third processing unit group $G_3$, and fourth processing unit group $G_4$. The second main transfer section $A_2$ is provided with a second main wafer transfer arm 17 for handling wafers W, which can selectively access the units located in the second processing unit group $G_2$, fourth processing unit group $G_4$, and fifth processing unit group $G_5$.

Temperature/humidity adjusting units 18 are respectively disposed between the first processing unit group $G_1$ and cassette station 11 and between the second processing unit group $G_2$ and interface station 13. Each of the temperature/humidity adjusting units 18 includes a temperature adjusting device for process liquids to be supplied to the first and second processing unit groups $G_1$ and $G_2$, and a duct for adjustment of temperature and humidity. Chemical unit (CHM) are respectively disposed below the first and second processing unit groups $G_1$ and $G_2$, for supplying chemical solutions to the first and second processing unit groups $G_1$ and $G_2$.

Figure 3:
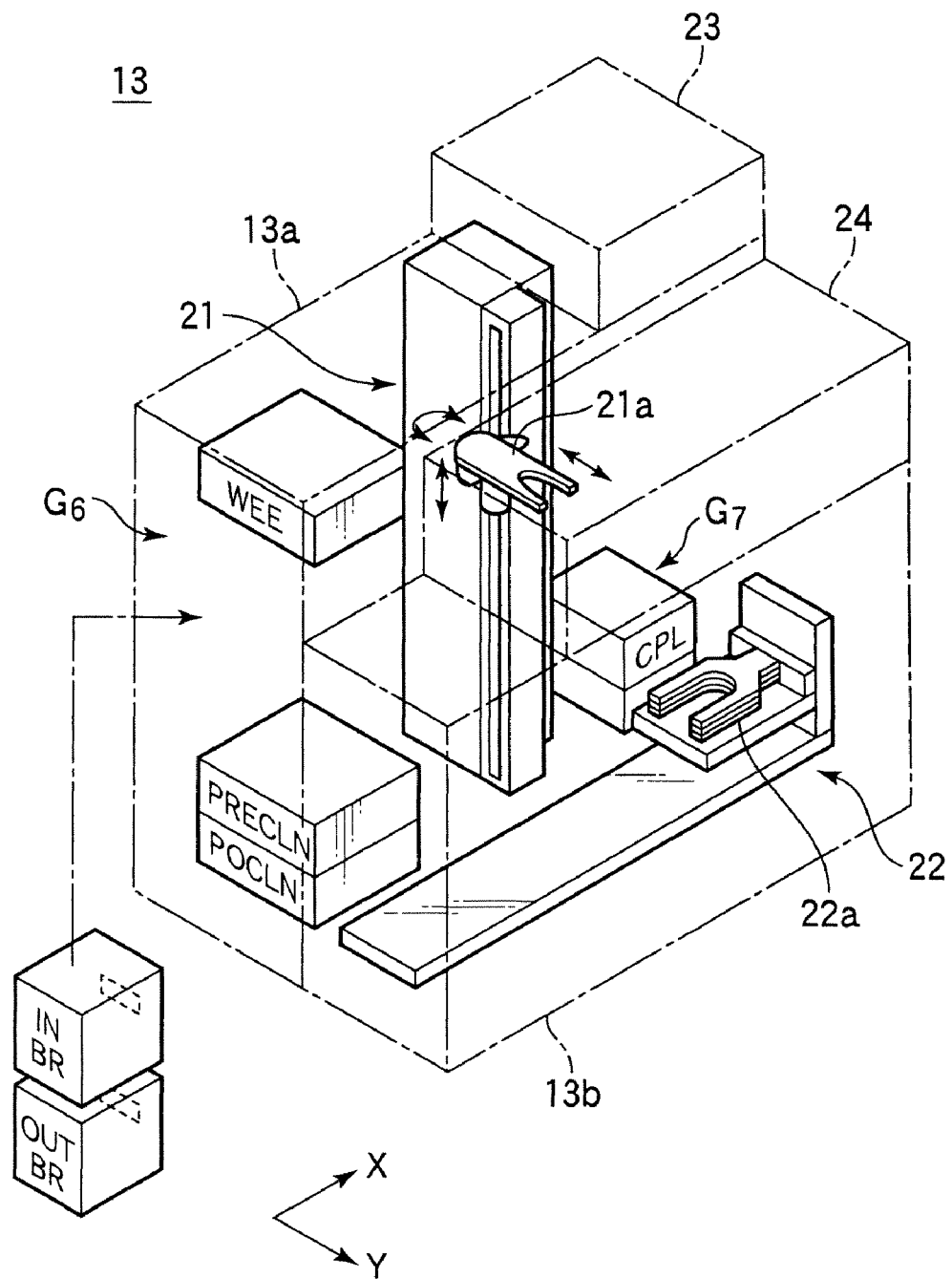
FIG. 3 is a perspective view schematically showing an interface station used in the pattern forming system shown in FIG. 1.

FIG. 3 is a perspective view schematically showing the interface station 13 used in the pattern forming system 1.

The interface station 13 has a casing that defines a first interface station 13a on the process station 12 side and a second interface station 13b on the light exposure apparatus 14 side. The first interface station 13a is provided with a first wafer transfer mechanism 21 disposed to face an opening portion of the fifth processing unit group $G_5$ for transferring wafers W. The second interface station 13b is provided with a second wafer transfer mechanism 22 movable in the X-direction for transferring wafers W.

A sixth processing unit group $G_6$ is located on the front side of the first interface station 13a, and includes a plurality of processing units stacked one on the other, which are formed of a periphery light exposure unit (WEE), an incoming buffer cassette (INBR), an outgoing buffer cassette (OUTBR), a pre-cleaning unit (PRECLN), and a post-cleaning unit (POCLN). The periphery light exposure unit (WEE) is used for performing light exposure selectively only on the edge portion of a wafer W to remove an unnecessary resist portion near the edge of the wafer. The incoming buffer cassette (INBR) is used for temporarily placing wafers W to be transferred into the light exposure apparatus 14. The outgoing buffer cassette (OUTBR) is used for temporarily placing wafers W transferred from the light exposure apparatus 14. The pre-cleaning unit (PRECLN) is used for cleaning a wafer to be transferred into the light exposure apparatus 14. The post-cleaning unit (POCLN) is used for cleaning a wafer transferred from the light exposure apparatus 14. The pre-cleaning unit (PRECLN) and post-cleaning unit (POCLN) correspond to a cleaning apparatus according to this embodiment.

A seventh processing unit group $G_7$ is located on the rear side of the first interface station 13a, and includes, e.g., two high-precision temperature adjusting units (CPL), stacked one on the other, for adjusting the temperature of a wafer W with high precision before light exposure.

The first wafer transfer mechanism 21 includes a fork 21a for transferring wafers W. The fork 21a can selectively access the units located in the fifth processing unit group $G_5$, sixth processing unit group G₆, and seventh processing unit group G₇ to transfer wafers W between these units.

The second wafer transfer mechanism 22 includes two forks 22a for transferring wafers W. The forks 22a can selectively access the pre-cleaning unit (PRECLN) and post-cleaning unit (POCLN) of the sixth processing unit group G₆, the units located in the seventh processing unit group G₇, and an incoming stage 14a and an outgoing stage 14b of the light exposure apparatus 14 described later to transfer wafers W between these portions.

A gas flow adjusting section 23 is disposed on top of the first interface station 13a to adjust the gas flow inside the first interface station 13a or interface station 13. A humidifier section 24 is disposed on top of the second interface station 13b to humidify the atmosphere inside the second interface station 13b or interface station 13 not to dry a wafer W transferred from the light exposure apparatus.

The light exposure apparatus 14 includes an incoming stage 14a for placing thereon wafers W transferred from the interface station 13, and an outgoing stage 14b for placing thereon wafers W to be transferred to the interface station 13. The light exposure apparatus 14 further includes an immersion light exposure section 30 structured to subject a resist film formed on a wafer W to light exposure in accordance with a predetermined pattern, while immersing the resist film in a high refractive index liquid having a higher refractive index than water or purified water. A wafer transfer mechanism 25 is disposed to transfer wafers W between the incoming stage 14a, immersion light exposure section 30, and outgoing stage 14b.

Figure 4:
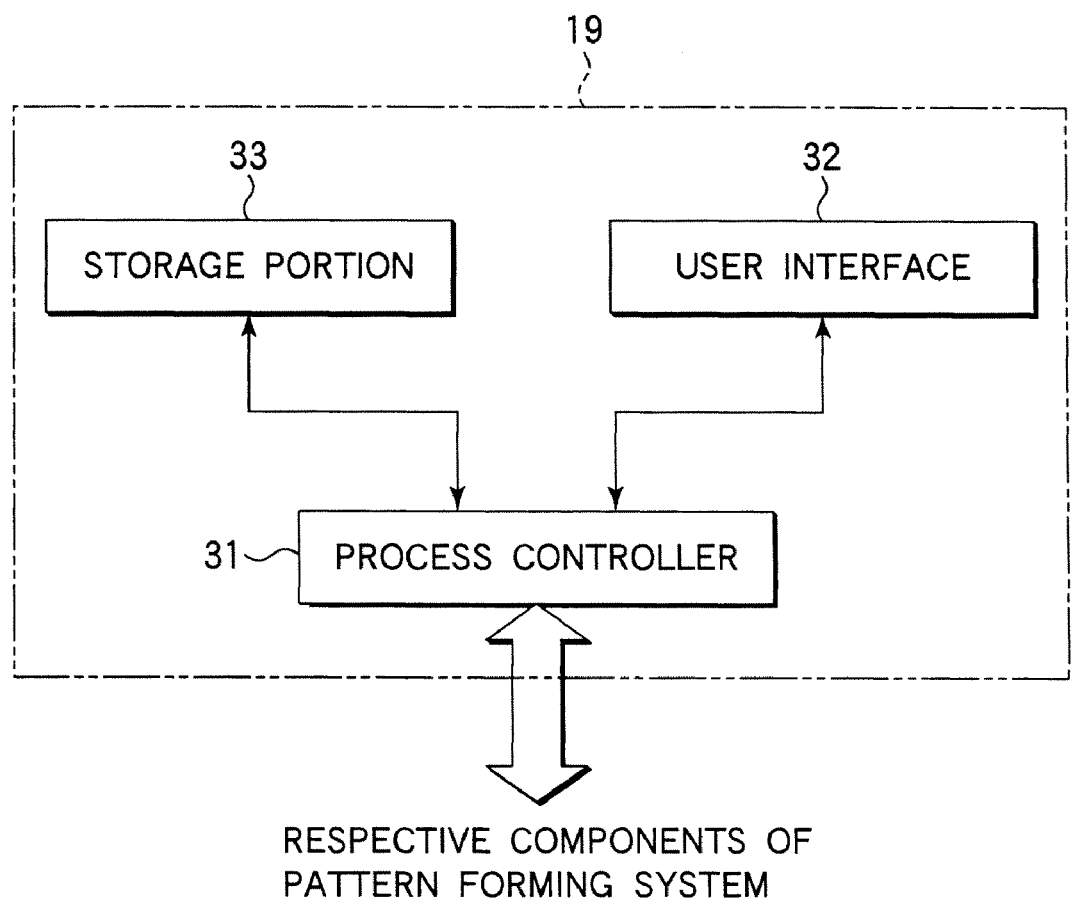
FIG. 4 is a block diagram showing a control section used in the pattern forming system shown in FIG. 1.

As shown in FIG. 2, a control section 19 is located below the cassette station 11 and is used for controlling this pattern forming system 1, as a whole. As shown in the block diagram of FIG. 4, this control section 19 includes a process controller 31 comprising a micro processor (computer) for controlling the respective components of the pattern forming system 1. The control section 19 further includes a user interface 32, which includes, e.g., a keyboard and a display, wherein the keyboard is used for an operator to input commands for operating the respective components of the pattern forming system 1, and the display is used for showing visualized images of the operational status of the respective components of the pattern forming system 1. The control section 19 further includes a storage portion 33, which stores data for performing processes.

The storage portion 33 stores various control programs for realizing various processes performed in the pattern forming system 1 under the control of the process controller 31. The storage portion 33 also stores a plurality of recipes with process condition data and process sequences recorded therein, and databases necessary for performing processes.

When a process is performed, a required recipe is retrieved from the storage portion 33 and executed by the process controller 31 in accordance with an instruction or the like input through the user interface 32. Consequently, each of various predetermined processes is performed in the pattern forming system 1 under the control of the process controller 31. Recipes may be stored in a computer readable storage medium, such as a CD-ROM, hard disk, flexible disk, or nonvolatile memory. Further, recipes may be utilized on-line, while it is transmitted from a suitable apparatus through, e.g., a dedicated line, as needed.

Components of pattern forming system 1 are respectively provided with their own subordinate controllers, which control the operation of the components in accordance with instructions transmitted from the process controller 31.

In the pattern forming apparatus 1 arranged as described above, wafers W are taken out one by one from a wafer cassette (CR) by the transfer pick 11d of the wafer transfer mechanism 11c. A wafer W thus taken out is transferred by the transfer pick 11d into the transit unit of the third processing unit group G₃ of the process station 12. Then, the wafer W is sequentially transferred by the first and second main transfer sections A₁ and A₂ through predetermined units in the first to fifth processing unit groups G₁ to G₅, so that the wafer W is subjected to a series of processes in accordance with the order prescribed in the recipe. For example, the wafer W is subjected to an adhesion process in the adhesion unit, formation of a resist film in one of the resist coating units (COT), and a pre-baking process in the pre-baking unit in this order. As needed, the wafer W is subjected to formation of a protection film on the resist film in one of the top coating units (ITC). In place of the adhesion process, the wafer W may be subjected to formation of an anti-reflective coating in one of the bottom coating units (BARC) before formation of the resist film. Further, the formation of an anti-reflective coating (TARC) on the resist film may be followed by formation of a protection film on the anti-reflective coating.

After the wafer W is subjected to a series of processes in the process station 12, the wafer W is transferred into the transit unit of the fifth processing unit group G₅. Then, the wafer W is sequentially transferred by the first wafer transfer mechanism 21 through the periphery light exposure unit (WEE), incoming buffer cassette (INBR), pre-cleaning unit (PRECLN), and high-precision temperature adjusting unit (CPL), so that the wafer W is subjected to a series of processes. Then, the wafer W is transferred by the second wafer transfer mechanism 22 to the incoming stage 14a of the light exposure apparatus 14. Then, the wafer W is transferred by the wafer transfer mechanism 25 to the immersion light exposure section 30, in which the wafer W is subjected to a light exposure process.

After the light exposure is finished in the immersion light exposure section 30, the wafer W is transferred by the wafer transfer mechanism 25 to the outgoing stage 14b. Then, the wafer W is transferred by the second wafer transfer mechanism 22 into the post-cleaning unit (POCLN), in which the wafer W is subjected to cleaning. Thereafter, the wafer W is transferred by the first wafer transfer mechanism 21 into the transit unit of the fifth processing unit group G₅. Then, the wafer W is sequentially transferred by the first and second main transfer sections A₁ and A₂ through predetermined units in the first to fifth processing unit groups G₁ to G₅, so that the wafer W is subjected to a series of processes in accordance with the order prescribed in the recipe. For example, the wafer W is subjected to a post-exposure baking process in the post-exposure baking unit, a developing process in one of the development units (DEV), and a post-baking process in the post-baking unit in this order. Then, the wafer W is transferred into the transit unit of the third processing unit group G₃, and is further transferred into a wafer cassette (CR) placed on the cassette station 11.

Next, an explanation will be given of a cleaning unit for immersion light exposure according to this embodiment.

The pattern forming system 1 includes the pre-cleaning unit (PRECLN) and the post-cleaning unit (POCLN), each of which is a cleaning unit for immersion light exposure according to this embodiment. Since these units have essentially the same structure and are controlled in essentially the same manner, only the pre-cleaning unit (PRECLN) will be explained as an example.

Figure 5:
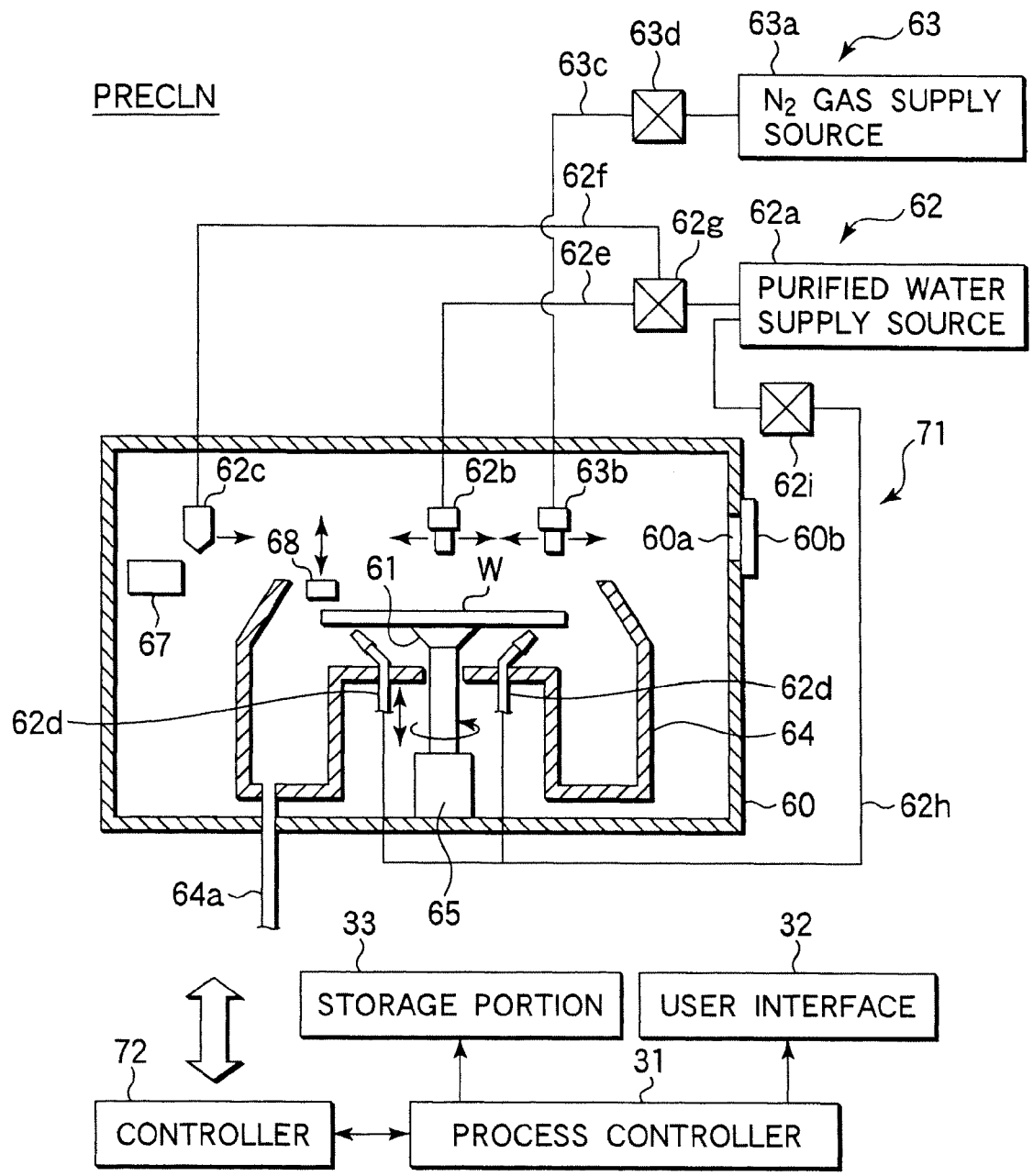
FIG. 5 is a sectional view schematically showing a pre-cleaning unit disposed in the pattern forming system shown in FIG. 1.

FIG. 5 is a sectional view schematically showing the pre-cleaning unit (PRECLN). As shown in FIG. 5, the pre-cleaning unit (PRECLN) includes a unit main body 71 for performing a cleaning process on a wafer W and a controller 72 for controlling the respective components of the unit main body 71.

The unit main body 71 includes a casing 60 for accommodating a wafer W, and a spin chuck 61 located inside the casing 60 to hold and rotate the wafer W in a horizontal state. A purified water supply mechanism 62 is disposed to supply purified water as a cleaning liquid (rinsing liquid) onto the wafer W held by the spin chuck 61. An $N_2$ gas supply mechanism is disposed to supply $N_2$ gas as a drying medium onto the surface of the spin chuck 61. A cup body 64 is disposed to receive a process liquid, such as a cleaning liquid, thrown off from the wafer W held by the spin chuck 61. The spin chuck 61 is rotated by a motor 65. Further, inside the casing 60, an ionizer 67 is disposed to supply ions onto the surface of the wafer W to remove electric charge, and an electric potential measuring unit 68 is disposed to measure the electric potential on the surface of the wafer W.

The casing 60 has two transfer ports 60a (only one of them is shown) formed in sidewalls thereof for transferring the wafer W into and from the casing 60 by the first and second wafer transfer mechanisms 21 and 22. The transfer ports 60a are respectively provided with shutters 60b. The spin chuck 61 is movable up and down, and is configured to hold the wafer W from the lower surface thereof by a vacuum attraction force, and to rotate the wafer W by the motor 65.

The purified water supply mechanism 62 includes a purified water supply source 62a for supplying purified water as a cleaning liquid. A first upper purified water nozzle 62b and a second upper purified water nozzle 62c are disposed to supply purified water from the purified water supply source 62a onto the front surface (upper side) of the wafer W held by the spin chuck 61. Two lower purified water nozzles 62d are disposed to supply purified water from the purified water supply source 62a onto the back surface (lower side) of the wafer W held by the spin chuck 61. The first upper nozzle 62b is connected to a conduit line 62e extending from the purified water supply source 62a. A conduit line 62f is branched from the conduit line 62e, and the distal end of the conduit line 62f is connected to the second upper purified water nozzle 62c. The branching portion of the conduit line 62e is provided with a valve 62g for switching the first upper purified water nozzle 62b and second upper purified water nozzle 62c and adjusting the flow rate therein. The two lower purified water nozzles 62d are connected to a conduit line 62h extending from the purified water supply source 62a. The conduit line 62h is provided with a valve 62i for adjusting the flow rate therein. The first upper purified water nozzle 62b is formed of a straight nozzle, while the second upper purified water nozzle 62c is formed of a slit nozzle, so that they can be selectively used in accordance with the surface state of a film formed on the wafer W, as described later. Each of the first and second upper purified water nozzles 62b and 62c is movable between a retreat position outside the wafer W and a process position directly about the wafer W. The first upper purified water nozzle 62b formed of a straight nozzle can delivery purified water while it is traveling in a cleaning process (rinsing process). The second upper purified water nozzle 62c formed of a slit nozzle is set stationary at a position directly about the center of the wafer W in a cleaning process (rinsing process).

The $N_2$ gas supply mechanism 63 includes an $N_2$ gas supply source 63a and an $N_2$ gas nozzle 63b for supplying $N_2$ gas onto the surface edge portion of the wafer W. The $N_2$ gas nozzle 63b is connected to the $N_2$ gas supply source 63a through a conduit line 63c for supplying $N_2$ gas. The conduit line 63c is provided with a valve 63d for adjusting the flow rate of $N_2$ gas flowing therethrough. $N_2$ gas is supplied in accordance with the surface state of the wafer W, as described later. The $N_2$ gas nozzle 63b is movable between a retreat position outside the wafer W and a process position directly about the wafer W. The $N_2$ gas nozzle 63b is movable along with movement of a supply portion of purified water during a cleaning process (rinsing process).

The cup body 64 is configured to surround the wafer W held by the spin chuck 61 when the spin chuck 61 holding the wafer W is moved down. Further, the upper end side of the cup body 64 is inclined upward and inward to reliably receive a process liquid supplied from the lower purified water nozzles 62d, as well as a process liquid thrown off from the wafer W. A drain line 64a for discharging a process liquid received in the cup body 64 is connected to the bottom wall of the cup body 64.

The controller 72 is arranged to control the respective components of the pre-cleaning unit (PRECLN) in accordance with instructions transmitted from the process controller 31.

As described above, each process performed inside the pre-cleaning unit (PRECLN) is controlled in accordance with a recipe stored in the storage portion 33. The storage portion 33 stores a plurality of basic recipes for cleaning processes, which can be selectively used. Further, as regards a cleaning process prior to light exposure, the storage portion 33 stores the relationships between parameter values representing the surface state of a film formed on a wafer W and hardware conditions, such as nozzles, and process conditions, such as purified water delivery rates, for performing suitable cleaning for the parameter values. When one of the basic recipes for cleaning processes stored in the storage portion 33 is selected, the process controller 31 fabricates a new recipe with reference to the data stored in storage portion 33, and performs a process based on the recipe thus fabricated. Specifically, the process controller 31 is arranged to change or set hardware conditions and/or process conditions to fabricate a new recipe, with reference to the relationships stored in the storage portion 33, in accordance with the surface state of a film formed on a wafer W. Examples of parameters representing the surface state are a contact angle, a surface electric potential, and an average surface roughness. Since the contact angle is most important among them, the contact angle may be solely used as a parameter representing the surface state, but all of the contact angle, surface electric potential, and average surface roughness are preferably used together.

For respective parameters representing the surface state, Tables 1 to 3 show examples of the relationships between parameter values representing the surface state of a film formed on a wafer W and hardware conditions, such as nozzles, and process conditions, such as purified water delivery rates, for performing suitable cleaning for the parameter values.

TABLE 1

| | | Contact angle | | |
|---|---|---|---|---|
| Item | Suppression target | ≤50° | Contact angel 50 to 90° | 90°< |
| Nozzle Type | Mist (water collision) and water film | Slit nozzle | Straight nozzle | |
| Nozzle angle | Mist (water collision) | — | ≤15° | 15 to 30° |

TABLE 1-continued

Contact angle

| Item | Suppression target | Contact angel ≦50° | 50 to 90° | 90°< |
|---|---|---|---|---|
| N₂ gas assistance | and water film | Yes | No | No |
| Liquid delivery rate (L/min) | Water film | 0.12 to 0.25 | 0.2 to 0.3 | 0.25 to 0.5 |
| Wafer rotational speed in delivery (rpm) | Water film | 0 to 100 | 100 (Small contact angle) to 200 (Large contact angle) | |

TABLE 2

Surface electric potential

| Item | Suppression target | Surface potential −50 V to +50 V | ≦−50 V or +50 V≦ |
|---|---|---|---|
| Ionizer | Floating charged particles | Not in operation | Automatically set in operation at timing from purified water delivery process to throwing-off and drying process |

TABLE 3

Average surface roughness

| Item | Suppression target | Average surface roughness ≦10 nm | 10 to 1,000 nm | 1,000 nm< |
|---|---|---|---|---|
| N₂ gas assistance (L/min) | Mist and striation | 0 | 3 to 5 | 5 to 10 |

Table 1 shows a case where the contact angle of a film formed on a wafer W is used as a parameter representing the surface state. Where the contact angle is large, a water film can be easily formed. Where the contact angle is small, a water film that cannot be suppressed by adjustment of the nozzle angle is formed. Further, depending on the contact angle, it is necessary to suppress mist generation due to purified water collision. In light of these factors, hardware conditions and process conditions are set in accordance with a value of the contact angle. These conditions include the type of the upper purified water nozzle, the angle of the upper purified water nozzle, use or nonuse of N₂ gas assistance from the N₂ gas nozzle 63b, the liquid delivery rate from the upper purified water nozzle, and the wafer rotational speed during purified water delivery.

The type of the upper purified water nozzle is suitably set to suppress mist generation due to purified water collision and water film formation. Specifically, in the case of a hydrophilic wafer with a contact angle of 50° or less, the stationary slit nozzle is selected. On the other hand, in the case of a hydrophobic wafer with a contact angle of more than 50°, the straight nozzle is selected.

The angle of the upper purified water nozzle and use or nonuse of N₂ gas assistance from the N₂ gas nozzle 63b are suitably set to suppress mist generation due to purified water collision and water film formation. The slit nozzle used in the case of a contact angle of 50° or less cannot adjust the angle. The nozzle angle of the straight nozzle is suitably set at a value of 15° or less where the contact angle is in a range of 50 to 90°, and set at a value of 15 to 30° where the contact angle is larger than 90°. Where the contact angle is 50° or less, the N₂ gas assistance is used, as well as use of the slit nozzle, to promote drying. On the other hand, where the contact angle is larger than 50°, the N₂ gas assistance is unnecessary.

The liquid delivery rate from the upper purified water nozzle is suitably set to suppress water film formation. In order to suppress water film formation, the liquid delivery rate is preferably set to be smaller with a decrease in contact angle. The liquid delivery rate is suitably set at a value of 0.12 to 0.25 L/min where the contact angle is 50° or less, set at a value of 0.2 to 0.3 L/min where the contact angle is 50° to 90°, and set at a value of 0.25 to 0.5 L/min where the contact angle is larger than 90°.

The wafer rotational speed during purified water delivery is suitably set to suppress water film formation. In order to suppress water film formation, the wafer rotational speed is preferably set to be smaller with a decrease in contact angle. The wafer rotational speed is set to be zero or 100 rpm or less (0 to 100 rpm) where the contact angle is 50° or less. The wafer rotational speed is set to be within a range of 100 to 200 rpm where the contact angle is larger than 50°, such that the speed is higher with an increase in contact angle.

Table 2 shows a case where the surface electric potential of a film formed on a wafer W is used as a parameter representing the surface state. In this case, the surface electric potential of the wafer is adjusted by the ionizer 67 as one of the hardware conditions and/or process conditions, as needed. This is conceived to reduce floating charged particles. Where the surface electric potential is in a range of −50 to +50V, the ionizer is not set in operation. Where the absolute value of the surface electric potential is larger than 50V (where the potential is larger than +50 or smaller than −50V), the ionizer 67 is set in operation to remove electric charge. The surface electric potential is measured by the electric potential measuring unit 68 when the wafer W is transferred into the pre-cleaning unit (PRECLN). The ionizer 67 is set in operation at some timing in a period from the purified water delivery process to the throwing-off and drying process. The ionizer 67 may be arranged to supply ions along with a down flow onto the wafer W, in place of supplying ions from a lateral sided of the wafer W, as shown in FIG. 5.

Table 3 shows a case where the average surface roughness of a film formed on a wafer W is used as a parameter representing the surface state. In this case, the N₂ gas assistance condition is adjusted as one of the hardware conditions and/or process conditions. This is conceived to decrease mist and striation. Where the surface roughness is large, a slight amount of water tends to remain in a striation pattern. Accordingly, N₂ gas is delivered to eliminate such a slight amount of water. Where the average surface roughness is 10 nm or less, this N₂ gas assistance is unnecessary. Where the average surface roughness is 10 nm to 1,000 nm, N₂ gas is delivered at a flow rate of 3 to 5 L/min during the purified water cleaning step (rinsing step). Where the average surface roughness is larger than 1,000 nm, N₂ gas is delivered at a flow rate of 5 to 10 L/min. The N₂ gas delivery position is located near the purified water delivery position.

Figure 6:
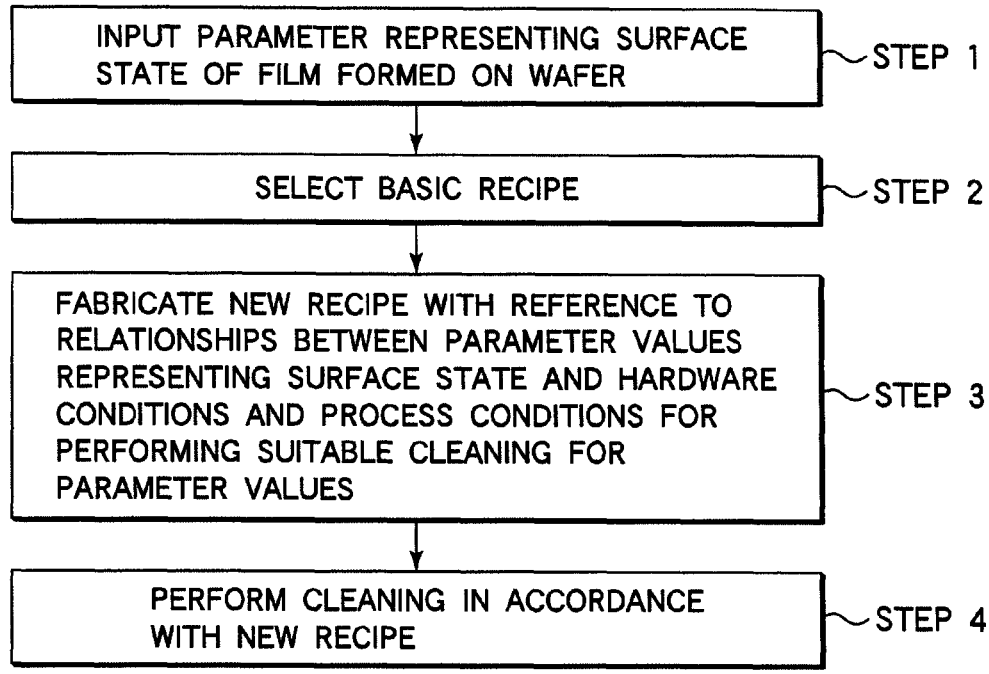
FIG. 6 is a flow chart showing a cleaning process operation performed on a wafer W in the pre-cleaning unit shown in FIG. 5.

Next, an explanation will be given of a cleaning process operation performed on a wafer W in the pre-cleaning unit (PRECLN) thus structured, with reference to the flow chart of FIG. 6. In the post-cleaning unit (POCLN), a cleaning process operation is performed on a wafer W in the same manner.

At first, parameters, such as the contact angle, surface electric potential, and average surface roughness, which represent the surface state of a film formed on a wafer W are input from the keyboard of the user interface 32 (STEP 1). As regards the contact angle and average surface roughness, values obtained in advance are input. As regards the surface electric potential, after a wafer W with a film formed thereon is inserted into the pre-cleaning unit (PRECLN), a value of the surface electric potential is measured by the electric potential measuring unit 68 and is then input.

Then, the basic recipes are displayed on the display of the user interface 32, and one of the basic recipes is selected (STEP 2). When a basic recipe is selected, the process controller 31 fabricates a new recipe by changing hardware conditions and/or process conditions of the selected basic recipe or creating hardware conditions and/or process conditions, with reference to the relationships shown in Tables 1 to 3, i.e., the relationships between parameter values representing the surface state of a film formed on a wafer W and hardware conditions, such as nozzles, and process conditions, such as purified water delivery rates, for performing suitable cleaning for the parameter values, stored in storage portion 33 (STEP 3). Then, the process controller 31 controls the pre-cleaning unit (PRECLN) to perform a cleaning process in accordance with the new recipe thus fabricated (STEP 4).

Figure 7:
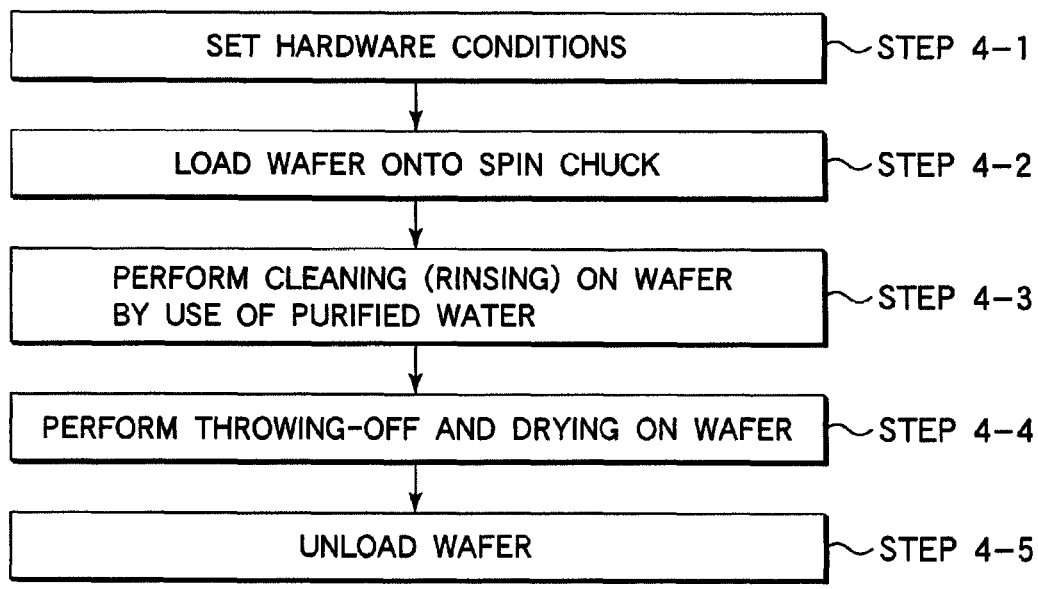
FIG. 7 is a flow chart showing a cleaning process operation in STEP 4 of FIG. 6.

For example, the cleaning process of STEP 4 is performed, as shown in FIG. 7. Specifically, hardware conditions, such as the angle of the first upper purified water nozzle 62b formed of the straight nozzle, are set with reference to the relationships described above, as needed (STEP 4-1). Then, the wafer W is loaded into the casing 60 and held on the spin chuck 61 (STEP 4-2). Thereafter, in accordance with the fabricated recipe, one of the first upper purified water nozzle 62b and second upper purified water nozzle 62c is used, and $N_2$ gas is supplied from the $N_2$ gas nozzle 63b, as needed, so that a cleaning process (rinsing process) is performed by use of purified water, while the flow rate of purified water and the rotational speed of the wafer W are controlled (STEP 4-3). In this case, depending on the surface electric potential of the wafer W, ions are supplied from the ionizer 67 to remove electric charge, as needed. After the cleaning process is finished, the supply of purified water is stopped, and the rotational speed of the wafer W is increased to perform throwing-off and drying (STEP 4-4). Thereafter, the wafer W is unloaded from the casing 60 (STEP 4-5).

As described above, when a parameter representing the surface state of a film formed on a wafer W is input, a new recipe is fabricated, and a cleaning process is performed in accordance with the new recipe. In fabricating the new recipe, conditions of a basic recipe are automatically changed or set, with reference to the relationships between parameter values representing the surface state of a film formed on a wafer W and hardware conditions and process conditions for performing suitable cleaning for the parameter values, stored in storage portion 33. Accordingly, there is no need to manually set hardware conditions or cleaning conditions, whereby a cleaning process prior to the immersion light exposure process can be performed very efficiently under suitable conditions. A cleaning process subsequent to the immersion light exposure process can be performed in the same manner, thereby providing the same effects.

Next, an explanation will be given of recipe examples fabricated according to this embodiment.

Recipe Example 1

In this example, a wafer having the following surface state was used:
a contact angle of 110°,
a surface electric potential of +1,000V, and
an average surface roughness of 0.5 nm.

When these values were input into the control section of the apparatus, a recipe was fabricated, as shown in following Table 4. Because of a surface electric potential of +1,000V, ion irradiation was performed by the ionizer in a period from the wafer loading to the process end. Further, because of a contact angle of 110° and an average surface roughness of 0.5 nm, the purified water rinsing was performed by the straight nozzle set at a nozzle angle of 30° without $N_2$ gas assistance, along with a wafer rotational speed of 200 rpm and a purified water flow rate of 250 mL/min.

TABLE 4

| Step | Time (sec) | Speed (rpm) | Acceleration (rpm/s) | Process | Slit nozzle Position | Straight nozzle Position | Nozzle angle (°) |
|---|---|---|---|---|---|---|---|
| 1. Wafer loading | 3.5 | 0 | 10,000 | I | Home | Center | |
| 2. Rising start | 0.5 | 200 | 10,000 | R I | Home | Center | 30 |
| 3. Rising end | 8.5 | 200 | 10,000 | R I | Home | Edge | 30 |
| 4. Throwing-off | 12.0 | 2,000 | 3,000 | I | Home | Home | |
| 5. Process end | 0.2 | 0 | 10,000 | I | Home | Home | |
| Total | 24.7 | | | | | | |

Rising    Purified water    250 mL/min
Back Rising    Purified water    250 mL/min
Ionizer set in operation
*R denotes rising and I denotes ionizer.

Recipe Example 2

In this example, a wafer having the following surface state was used:

a contact angle of 110°, a surface electric potential of +1,000V, and an average surface roughness of 50 nm.

When these values were input into the control section of the apparatus, a recipe was fabricated, as shown in following Table 5. Because of a surface electric potential of +1,000V, ion irradiation was performed by the ionizer in a period from the wafer loading to the process end. Further, because of a contact angle of 110° and an average surface roughness of 50 nm, the purified water rinsing was performed by the straight nozzle set at a nozzle angle of 30° with $N_2$ gas assistance set at an $N_2$ gas flow rate of 5 L/min, along with a wafer rotational speed of 200 rpm and a purified water flow rate of 300 mL/min.

TABLE 5

| Step | Time (sec) | Speed (rpm) | Acceleration (rpm/s) | Process | Slit nozzle Position | Straight nozzle Position | Nozzle angle (°) |
|---|---|---|---|---|---|---|---|
| 1. Wafer loading | 3.5 | 0 | 10,000 | I | Home | Center | |
| 2. Rising start | 0.5 | 200 | 10,000 | R I $N_2$ | Home | Center | 30 |
| 3. Rising end | 8.5 | 200 | 10,000 | R I $N_2$ | Home | Edge | 30 |
| 4. Throwing-off | 12.0 | 2,000 | 3,000 | I | Home | Home | |
| 5. Process end | 0.2 | 0 | 10,000 | I | Home | Home | |
| Total | 24.7 | | | | | | |

Rising　Purified water　300 mL/min
$N_2$　5 L/min
Ionizer set in operation
*R denotes rising and I denotes ionizer.

Recipe Example 3

In this example, a wafer having the following surface state was used:
a contact angle of 40°,
a surface electric potential of +1,000V, and
an average surface roughness of 0.5 nm.

When these values were input into the control section of the apparatus, a recipe was fabricated, as shown in following Table 6. Because of a surface electric potential of +1,000V, ion irradiation was performed by the ionizer in a period from the wafer loading to the process end. Further, because of a contact angle of 40° and an average surface roughness of 0.5 nm, the purified water rinsing was performed by the slit nozzle, along with a wafer rotational speed of 0 rpm and a purified water flow rate of 120 mL/min. The throwing-off and drying was performed with $N_2$ gas assistance set at an $N_2$ gas flow rate of 3 L/min.

TABLE 6

| Step | Time (sec) | Speed (rpm) | Acceleration (rpm/s) | Process | Slit nozzle Position | Straight nozzle Position | Nozzle angle (°) |
|---|---|---|---|---|---|---|---|
| 1. Wafer loading | 3.5 | 0 | 10,000 | I | Home | Home | |
| 2. Rising start | 0.5 | 0 | 10,000 | R I | Home | Home | |
| 3. Rising end | 8.5 | 0 | 10,000 | R I | Center | Home | |
| 4. Throwing-off | 12.0 | 2,000 | 3,000 | I $N_2$ | Edge | Home | |
| 5. Process end | 0.2 | 0 | 10,000 | I | Home | Home | |
| Total | 24.7 | | | | | | |

Rising　Purified water　250 mL/min
Back Rising　Purified water　200 mL/min
$N_2$　3 L/min
Ionizer set in operation
*R denotes rising and I denotes ionizer.

In the columns concerning nozzle positions in Tables 4 to 6, "Home" denotes a retreat position outside the wafer, "Center" denotes a position directly about the center of the wafer, and "Edge" denotes a position directly about the edge of the wafer.

The embodiment described above is arranged to store in advance the relationships between parameter values representing the surface state of a film formed on a substrate and hardware conditions and/or process conditions for performing suitable cleaning for the parameter values. When a parameter value representing the surface state of a film formed on a substrate is input, a new process recipe is fabricated with reference to the relationships, such that the new process recipe contains hardware conditions and/or process conditions corresponding to the surface state. Then, a cleaning process is performed in accordance with the new process recipe. In this case, optimum hardware conditions and/or process conditions can be automatically set to fit in with the film formed on the substrate. Consequently, the cleaning process can be efficiently performed on the substrate under suitable conditions, before and/or after the immersion light exposure process.

The present invention has been described with reference to a typical embodiment, but the present invention is not limited to the embodiment described above, and it may be modified in various manners. For example, in the embodiment described above, parameters representing the surface state are exemplified by the contact angle, surface electric potential, and average surface roughness, but another parameter may be additionally used. In the embodiment described above, the coating film includes a protection film formed on a resist film, but the protection film is not essential. Further, Tables 1 to 3 merely show examples, which are typical but not limiting, of the relationships between parameter values representing the surface state of a film formed on a wafer and hardware conditions, such as nozzles, and process conditions, such as purified water delivery rates, for performing suitable cleaning for the parameter values. Similarly, Tables 4 to 6 merely show recipe examples, and different basic recipes may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cleaning apparatus for immersion light exposure, for cleaning a substrate before and/or after immersion light exposure to subject a resist film formed on a surface of the substrate to a light exposure process through a liquid, the cleaning apparatus comprising:
a cleaning apparatus main body including components configured to perform a cleaning process on the substrate by use of a cleaning liquid; and
a control section configured to control the components of the cleaning apparatus main body,
wherein the control section is equipped with a non-transitory computer readable storage portion that stores a control program and stores relationships between values of one or more parameters and hardware and/or process conditions, to perform suitable cleaning for the values, the one or more parameters representing a surface state of a film formed on the substrate and including a contact angle of the film, the hardware and/or process conditions including a delivery rate of the cleaning liquid, and
the control program causes the control section to fabricate a new process recipe with reference to the relationships in response to input of a specific value of the contact angle of the film formed on a target substrate, one of the relationships prescribing that with a decrease in the specific value of the contact angle of the film the delivery rate of the cleaning liquid is reduced to suppress a film formation of the cleaning liquid, such that the new process recipe contains hardware and/or process conditions corresponding to the specific value, and the control program causes the control section to control the cleaning apparatus main body to perform the cleaning process on the target substrate in accordance with the new process recipe.

2. The cleaning apparatus for immersion light exposure according to claim 1, wherein the non-transitory computer readable storage portion stores a basic recipe that includes basic process conditions, and the control program causes the control section to fabricate the new process recipe by changing the hardware and/or process conditions of the basic recipe or by creating hardware and/or process conditions, with reference to the relationships.

3. The cleaning apparatus for immersion light exposure according to claim 1, wherein the non-transitory computer readable storage portion stores a plurality of basic recipes each including basic process conditions, and the control program causes the control section to fabricate the new process recipe by changing hardware and/or process conditions of a selected one of the basic recipes or by creating hardware and/or process conditions.

4. The cleaning apparatus for immersion light exposure according to claim 1, wherein the components include a spin chuck configured to hold and rotate the substrate, and a cleaning liquid nozzle configured to supply the cleaning liquid onto the substrate held on the spin chuck, and
the control program causes the control section to set, as the hardware and/or process conditions, an angle of the cleaning liquid nozzle, a cleaning liquid delivery rate, and a rotational speed of the target substrate during cleaning liquid delivery.

5. The cleaning apparatus for immersion light exposure according to claim 1, wherein the one or more parameters include a surface electric potential and an average surface roughness in addition to the contact angle of the film.

6. The cleaning apparatus for immersion light exposure according to claim 5, wherein the components include a spin chuck configured to hold and rotate the substrate, a cleaning liquid nozzle that supplies the configured to supply the cleaning liquid onto the substrate held on the spin chuck, an $N_2$ gas nozzle configured to supply $N_2$ gas onto the substrate, and an ionizer configured to remove electric charge from a surface of the substrate, and
the control program causes the control section to set, as the hardware and/or process conditions, an angle of the cleaning liquid nozzle, use or nonuse of $N_2$ gas supply, use or nonuse of the ionizer to remove electric charge from a surface of the target substrate, a cleaning liquid delivery rate, and a rotational speed of the target substrate during cleaning liquid delivery.

7. A cleaning method for immersion light exposure, for cleaning a substrate in a cleaning apparatus for immersion light exposure which includes a cleaning apparatus main body including components that perform a cleaning process on the substrate by use of a cleaning liquid, before and/or after immersion light exposure to subject a resist film formed on a surface of the substrate to a light exposure process through a liquid, the cleaning method comprising:
equipping a control section of the cleaning apparatus with a non-transitory computer readable storage portion storing a control program;
storing in the storage portion relationships between values of one or more parameters and hardware and/or process conditions, to perform suitable cleaning for the values, the one or more parameters representing a surface state of a film formed on the substrate and including a contact angle of the film, the hardware and/or process conditions including a delivery rate of the cleaning liquid; and
inputting into the control section a specific value of the contact angle of the film formed on a target substrate and operating the cleaning apparatus under control of the control section in accordance with the control program, which causes the control section to fabricate a new process recipe with reference to the relationships, one of the relationships prescribing that with a decrease in the specific value of the contact angle of the film the delivery rate of the cleaning liquid is reduced to suppress a film formation of the cleaning liquid, such that the new process recipe contains hardware and/or process conditions corresponding to the specific value, and which causes the control section to control the cleaning apparatus main body to perform the cleaning process in accordance with the new process recipe.

8. The cleaning method for immersion light exposure according to claim 7, further comprising:
storing in the storage portion a basic recipe that includes basic process conditions, and the control program causes the control section to fabricate the new process recipe by changing hardware and/or process conditions of the basic recipe or by creating hardware and/or process conditions, with reference to the relationships.

9. The cleaning method for immersion light exposure according to claim 7, further comprising:
storing in the storage portion a plurality of basic recipes each including basic process conditions, and the control program causes the control section to fabricate the new process recipe by changing hardware and/or process conditions of a selected one of the basic recipes or by creating hardware and/or process conditions.

10. The cleaning method for immersion light exposure according to claim 7, further comprising:

equipping the components with a spin chuck configured to hold and rotate the substrate, and with a cleaning liquid nozzle configured to supply the cleaning liquid onto the substrate held on the spin chuck, and the control program causes the control section to set, as the hardware and/or process conditions, an angle of the cleaning liquid nozzle, a cleaning liquid delivery rate, and a rotational speed of the target substrate during cleaning liquid delivery.

11. The cleaning method for immersion light exposure according to claim 7, wherein the inputting into the control section includes the one or more parameters including a surface electric potential and an average surface roughness in addition to the contact angle of the film.

12. The cleaning method for immersion light exposure according to claim 11, further comprising:

equipping the components with a spin chuck configured to hold and rotate the substrate, a cleaning liquid nozzle configured to supply the cleaning liquid onto the substrate held on the spin chuck, an $N_2$ gas nozzle configured to supply $N_2$ gas onto the substrate, and an ionizer configured to remove electric charge from a surface of the substrate, and the control program causes the control section to set, as the hardware and/or process conditions, an angle of the cleaning liquid nozzle, use or nonuse of $N_2$ gas supply, use or nonuse of the ionizer to remove electric charge from a surface of the target substrate, a cleaning liquid delivery rate, and a rotational speed of the target substrate during cleaning liquid delivery.

13. A control apparatus for controlling a cleaning apparatus for immersion light exposure that includes a cleaning apparatus main body including components configured to perform a cleaning process on a substrate by use of a cleaning liquid, the control apparatus comprising:

a non-transitory computer readable storage portion that stores a control program and stores relationships between values of one or more parameters and hardware and/or process conditions, to perform suitable cleaning for the values, the one or more parameters representing a surface state of a film formed on the substrate and including a contact angle of the film, the hardware and/or process conditions including a delivery rate of the cleaning liquid;

an input part to input a specific value of the contact angle of the film formed on a target substrate; and an arithmetical operation part that executes the control program, which causes the arithmetical operation part to fabricate a new process recipe with reference to the relationships in response to input of the specific value of the contact angle of the film, one of the relationships prescribing that with a decrease in the specific value of the contact angle of the film the delivery rate of the cleaning liquid is reduced to suppress a film formation of the cleaning liquid, such that the new process recipe contains hardware and/or process conditions corresponding to the specific value, and which causes the arithmetical operation part to control the cleaning apparatus main body to perform the cleaning process on the target substrate in accordance with the new process recipe.

14. A non-transitory computer readable storage medium that stores a control program to be used in a control section of a cleaning apparatus for immersion light exposure that includes a cleaning apparatus main body including components configured to perform a cleaning process on a substrate by use of a cleaning liquid, and a portion storing relationships between values of one or more parameters and hardware and/or process conditions, to perform suitable cleaning for the values, the one or more parameters representing a surface state of a film formed on the substrate and including a contact angle of the film, the hardware and/or process conditions including a delivery rate of the cleaning liquid, and the control program, when executed on a computer, causing the cleaning apparatus to perform a method comprising:

fabricating a new process recipe with reference to the relationships in response to input of a specific value of the contact angle of the film formed on a target substrate, one of the relationships prescribing that with a decrease in the specific value of the contact angle of the film the delivery rate of the cleaning liquid is reduced to suppress a film formation of the cleaning liquid, such that the new process recipe contains hardware and/or process conditions corresponding to the specific value; and performing the cleaning process on the target substrate in accordance with the new process recipe.

15. The cleaning apparatus for immersion light exposure according to claim 4, wherein the relationships further prescribe that, with a decrease in the specific value of the contact angle of the film, the angle of the cleaning liquid nozzle is reduced relative to a direction normal to a surface of the target substrate to be cleaned, and the rotational speed of the substrate during cleaning liquid delivery is reduced.

16. The cleaning apparatus for immersion light exposure according to claim 15, wherein the components further include a slit nozzle configured to generate a mist of the cleaning liquid and an $N_2$ gas nozzle configured to supply $N_2$ gas onto the substrate, and the relationships further prescribe that, with a decrease in the specific value of the contact angle of the film, the slit nozzle is used in place of the cleaning liquid nozzle, and $N_2$ gas supply is used in a throwing-off operation of rotating the substrate after cleaning the substrate with the cleaning liquid.

17. The cleaning apparatus for immersion light exposure according to claim 6, wherein the relationships further prescribe that, with a decrease in the specific value of the contact angle of the film, the angle of the cleaning liquid nozzle is reduced relative to a direction normal to a surface of the target substrate to be cleaned, and the rotational speed of the substrate during cleaning liquid delivery is reduced, and further prescribe that, with an increase in a specific value of an average surface roughness, an $N_2$ gas supply rate is increased when cleaning the substrate with cleaning liquid.

18. The cleaning method for immersion light exposure according to claim 10, wherein the storing in the storage portion relationships includes relationships that further prescribe that, with a decrease in the specific value of the contact angle of the film, the angle of the cleaning liquid nozzle is reduced relative to a direction normal to a surface of the target substrate to be cleaned, and the rotational speed of the substrate during cleaning liquid delivery is reduced.

19. The cleaning method for immersion light exposure according to claim 18, wherein the equipping the components further includes equipping a slit nozzle configured to generate a mist of the cleaning liquid and an $N_2$ gas nozzle configured to supply $N_2$ gas onto the substrate, and the storing in the storage portion relationships includes relationships that further prescribe that, with a decrease in the specific value of the contact angle of the film, the slit nozzle is used in place of the cleaning liquid nozzle, and $N_2$ gas supply is used in a throwing-off operation of rotating the substrate after cleaning the substrate with the cleaning liquid.

20. The cleaning method for immersion light exposure according to claim 12, wherein the storing in the storage portion relationships includes relationships that further prescribe that, with a decrease in the specific value of the contact angle of the film, the angle of the cleaning liquid nozzle is reduced relative to a direction normal to a surface of the target substrate to be cleaned, and the rotational speed of the substrate during cleaning liquid delivery is reduced, and further prescribe that, with an increase in a specific value of an average surface roughness, an $N_2$ gas supply rate is increased when cleaning the substrate with cleaning liquid.

* * * * *